(12) United States Patent
Mueller

(10) Patent No.: US 8,823,422 B2
(45) Date of Patent: Sep. 2, 2014

(54) CIRCUIT FOR SWITCHING ELECTRIC POTENTIALS VIA AUTARKIC, SELF-SUPPLYING STAGES

(75) Inventor: Helmut Mueller, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/636,349

(22) PCT Filed: Mar. 21, 2011

(86) PCT No.: PCT/IB2011/051161
§ 371 (c)(1),
(2), (4) Date: Dec. 7, 2012

(87) PCT Pub. No.: WO2011/117796
PCT Pub. Date: Sep. 29, 2011

(65) Prior Publication Data
US 2013/0135031 A1 May 30, 2013

(30) Foreign Application Priority Data
Mar. 24, 2010 (EP) .................................... 10157449

(51) Int. Cl.
*H03K 3/00* (2006.01)
(52) U.S. Cl.
USPC ........................................... 327/108; 327/112
(58) Field of Classification Search
USPC ................................................. 327/108–112
See application file for complete search history.

(56) References Cited

U.S. PATENT DOCUMENTS

| 5,440,202 | A | | 8/1995 | Mathews et al. | |
|---|---|---|---|---|---|
| 5,475,333 | A | | 12/1995 | Kumagai | |
| 5,686,859 | A | * | 11/1997 | Majumdar et al. | ............ 327/530 |
| 5,886,563 | A | * | 3/1999 | Nasila | ............................ 327/423 |
| 6,008,549 | A | | 12/1999 | Cooper et al. | |
| 7,046,049 | B2 | * | 5/2006 | Deppe | ............................ 327/108 |
| 7,450,689 | B2 | | 11/2008 | Soto | |
| 2008/0089482 | A1 | | 4/2008 | Soto | |

FOREIGN PATENT DOCUMENTS

| EP | 0740406 | 10/1996 |
|---|---|---|
| EP | 2040379 | 3/2009 |

OTHER PUBLICATIONS

Xiaoliang Xie et al, "Picosecond Time-Resolved Circular Dichroism Spectroscopy: Experimental Details and Applications", Review of Scientific Instruments, AIP, Melville, NY, US, vol. 60, No. 8, Aug. 1, 1989.
S.K. Biswas et al, "Gate Drive Methods for IGBTs in Bridge Configurations", Industry Applications Society Annual Meeting, 1994, Conference Record of the 1994 IEEE,Denver, CO, US, Oct. 2-6, 1994, New York, NY USA, pp. 1310-1316.

* cited by examiner

*Primary Examiner* — Kenneth B. Wells

(57) ABSTRACT

A switching circuit for switching electric potentials, such as a capacitive high voltage load in an X-ray generator is structured into plural stages having an electronic switch, wherein the electronic switches of the different stages are arranged in series, in order to form a series conduction line for switching the electric potentials. The plural stages draw energy from the series conduction line during the time period when the series conduction line is blocked and charge an energy storage. This stored energy can be utilized for closing the series conduction line and maintaining this closed state. Further, disclosed is a method for discharging an electric load by means of a switching circuit. Also disclosed are a high voltage generator, an X-ray generator and a medical imaging system, each having such a switching circuit.

20 Claims, 5 Drawing Sheets

CIRCUIT FOR SWITCHING ELECTRIC POTENTIALS VIA AUTARKIC, SELF-SUPPLYING STAGES

FIELD OF THE INVENTION

The present invention relates to a switching circuit for switching electric potentials, a method for switching electric potentials, and a high voltage generator, an X-ray generator and a medical imaging system having such a switching circuit. Preferably, the present invention relates to a high voltage switching circuit for discharging an electric load within an X-ray generator.

BACKGROUND OF THE INVENTION

High voltage switching circuits using semiconductor technology are known for switching high voltages. In order to be able to switch high voltages with relatively easy damageable semiconductors, these switching circuits are split in several stages each of which undergoes only part of the overall voltage.

Several types of switching circuits (crowbars) are known. However, most of them use plural toroid cores or complex auxiliary supplies for driving the semiconductors. Others implement a sort of master slave configuration or cascade arrangement, in which only one stage is driven (the master) and the others follow consecutively.

EP 2 040 379 A2 describes a circuit for servicing a load connectable with a power supply. The circuit comprises a plurality of three-terminal switches and one control supply. The three-terminal switches define a series conduction path connectable between the power supply and the load. The three-terminal switches include a source terminal, a drain terminal and a gate terminal. The circuit further includes an isolation circuit disposed between a control supply and the gate terminal of each switch. The isolation circuit operates in conjunction with the control supply and the controller to provide an isolated voltage at the gate terminals of each switch such that an open switch potential does not exceed the control voltage required to close the connection.

However, this design is rather complex such that there is a need for a switching circuit with a more simplified design.

SUMMARY OF THE INVENTION

It is an object of the invention to provide a switching circuit having a more simplified design.

This object is solved with the switching circuit according to the independent claim. Advantageous further developments are subject of the dependent claims.

According to an embodiment of the invention, there is provided a switching circuit for switching electric potentials, in particular for discharging an electric load, such as a capacitive high voltage load of a high voltage cable. In this description the term "high voltage" refers to voltages of more than 4 kV. The switching circuit comprises a plurality of stages each comprising an electronic switch which is preferably a transistor, in particular an N-channel MOSFET or an IGBT. Each electronic switch has a switchable path controllable by means of a control terminal (e.g. gate/base of a transistor), wherein the switchable paths of the electronic switches are connected in series in between the electric potentials to be switched or the electric load to be discharged. In case of a transistor, the switchable path is the drain-source-passage or the collector-emitter-passage. More specifically, the series arrangement is implemented such that the source (or emitter) of one transistor is connected with the drain (or collector) of the consecutive transistor. The series arrangement of the switchable path forms a "series conduction line" for connecting the electric potentials to be switched. Each stage further comprises an energy storage, such as a capacitor or an accumulator, which is charged while the respective electronic switch is in an opened state (high-resistive switchable path) with a current branched off from the switchable path within the stage and caused by a voltage drop across the opened switchable path. In this context, the energy storage is preferably charged while the respective electronic switch is in an opened state exclusively with a current branched off from the switchable path within the stage. Further, the switching circuit comprises a driver stage for switching the electronic switch by means of providing the control terminal of the electronic switch with energy stored in the energy storage for closing the switchable path of the electronic switch and maintaining the closed state (low-resistive switchable path) at least temporarily. Preferably, each stage is designed identically. This design provides stages which are free of any power supply line supplying energy besides the lines connected to the switchable paths of the respective electronic switches. It also provides stages which are free of connection lines among each other besides the connection along the switchable paths of the electronic switches.

This embodiment provides the advantages that the necessary wiring can be reduced. No additional power supply for providing power fed to the control terminal of the electronic switch is necessary. Thus, an autarkic, self-supplying switching circuit can be provided due to its autarkic, self-supplying stages.

These advantages can also be achieved with the method for switching electric potentials by means of such a switching circuit, or with a high voltage generator, an X-ray generator or a medical imaging system having such a switching circuit.

According to a further embodiment each stage has a photo element, such as a photo transistor, for initiating a switching of the electronic switch. Due to integrating the photo elements into the stages, respectively, wiring for control lines can be saved. Moreover, this arrangement enables a galvanic separation of high voltage parts of the high voltage generator, such as the high voltage switching circuit, from a low voltage control unit.

Moreover, it can be envisaged that each stage further comprises at least one photovoltaic element for additionally charging the energy storage. When a light source for driving the photo elements is turned on and causes a discharging of the energy storage, the light emitted by the light source can be received by the at least one photovoltaic element and supplied to the energy storage. This has the advantage that current can be supplied to the control terminal of the electronic switch for an extended time period.

It may be seen as the gist of the invention to provide a high voltage switching circuit having plural stages all of which draw their energy from the series conduction line used for discharging the high voltage load. During the time period when the series conduction line is blocked, the energy storages of the stages are charged with energy which is later on utilized for closing and maintaining the closed state of the series conduction line.

DETAILED DESCRIPTION OF EMBODIMENTS

The present invention is directed to a high voltage switching circuit, also referred to as a crowbar, with stages each of which has a self-supply character. Each single stage is provided with its own photo transistor such that all stages can be activated simultaneously by means of turning on a central light source the light of which is received by the photo transistor.

Figure 1:
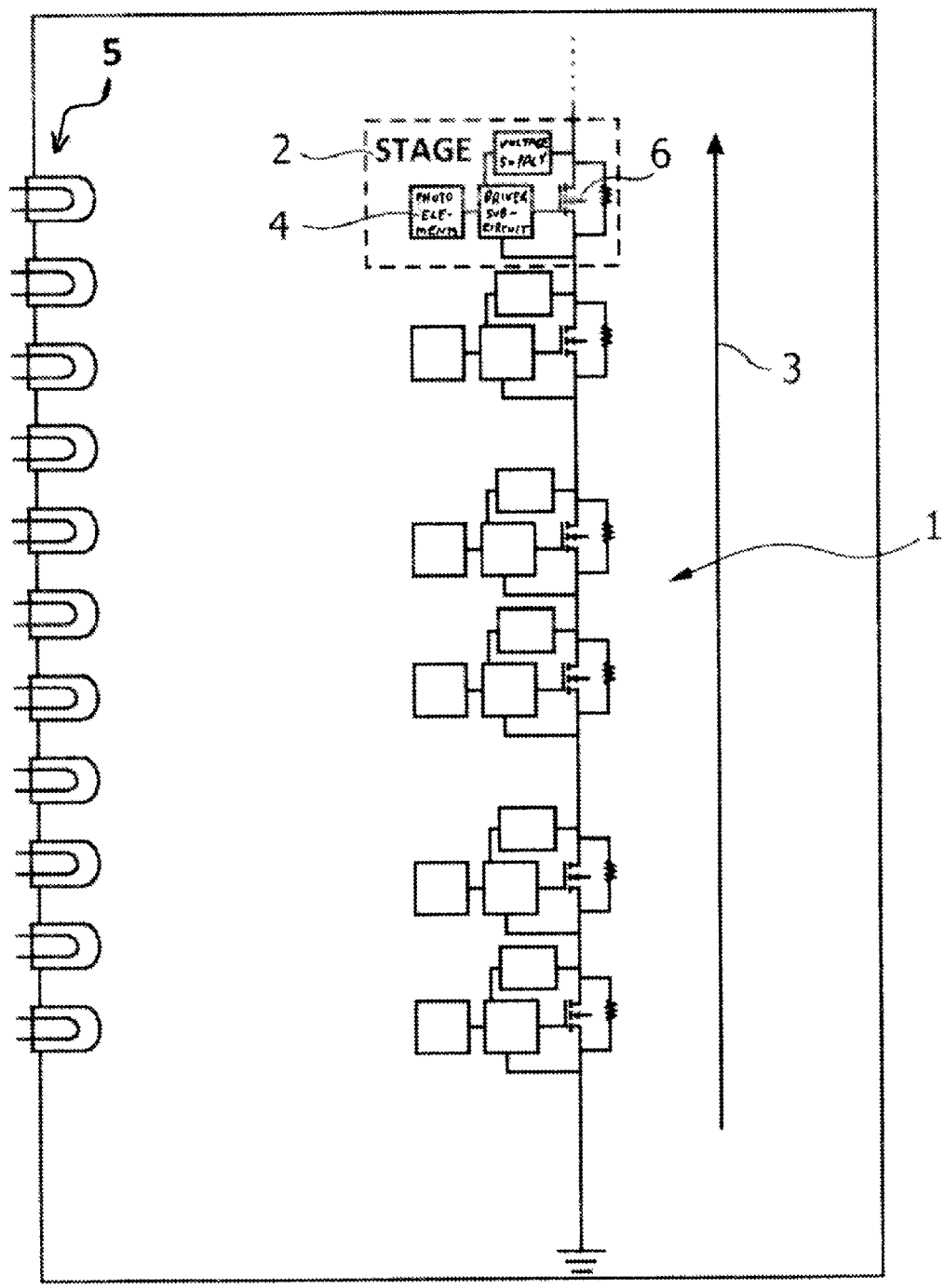
FIG. 1 shows a schematic diagram of a high voltage switching circuit according to an embodiment of the invention.

FIG. 1 shows a schematic diagram of a high voltage switching circuit 1 according to an embodiment of the invention. The switching circuit 1 comprises a plurality of stages 2, one of which is exemplary framed with a dashed line, connected in series to a high voltage load to be discharged. Reference numeral 3 marks the resulting high voltage potential applied across the stages 2.

In X-ray high voltage generators (described in connection with FIG. 5) potentials of up to 140 kV are present. When operating an X-ray generator, a rapid switching of the high voltage is required (within µs), in order to lower the X-ray dose for the patient to be examined. In order to realize such a quick switching of voltages having such a magnitude, the residual capacitive load of a power cable supplying energy from a high voltage generator to an X-ray tube (all of which are parts of the X-ray generator) has to be discharged. This can be realized with the high voltage switching circuit. More precisely, an electronic switch 6 provided in each stage 2 is switched from an opened state into a closed state such that the switching circuit 2 forms a low-resistive path via which the high voltage load can be discharged. Since single semiconductor elements are only capable of switching a certain voltage, e.g. up to 4 kV, the stages 2 are arranged in series in order to divide the overall voltage of the load to be discharged equally over the entirety of stages 2. In this description, the term "opened state" of the electronic switch refers to the switchable path of this electronic switch being high-resistive, i.e. in case of the electronic switch being a transistor, the collector-emitter-passage or the drain-source-passage being high-resistive, such that substantially no current can pass. Mutatis mutandis, the term "closed state" of the electronic switch refers to the switchable path of this electronic switch being low-resistive, i.e. in case of the electronic switch being a transistor, the collector-emitter-passage or the drain-source-passage being low-resistive, such that current can pass substantially unresisted.

The number of stages 2 can be adapted to the magnitude of the voltage applied to the switching circuit 1. In the present case, the voltage of the electric load to be discharged is up to 140 kV what requires 45 to 200 stages depending on the used MOSFET or IGBT switches and their maximum breakdown voltage. However, the scope of the invention is not limited to a certain number of stages, but shall cover any amount.

The switching state of the electronic switch 6 of each stage 2, i.e. the closed or the opened state, can be controlled via a photo element 4 provided in each stage 2. The photo elements 4, for which photo transistors are used, are arranged so as to be able to receive light emitted from a high frequency light source 5. The light source 5 is preferably a plurality of light emitting diodes, but could also be a single or several lamp(s). When the discharging of the load is required in an X-ray high voltage generator, the light source 5 is turned on by a controller (not shown). The emitted light is received by the photo elements 4 which in turn initiate that the electronic switches 6 of the individual stages 2 adapt their closed states. By using a light source 5 and the photo elements 4, all stages 2 can be switched simultaneously. Moreover, this arrangement enables a galvanic separation of high voltage parts of the X-ray generator (such as the high voltage switching circuit) from a control circuit to which the light source is associated.

Figure 2:
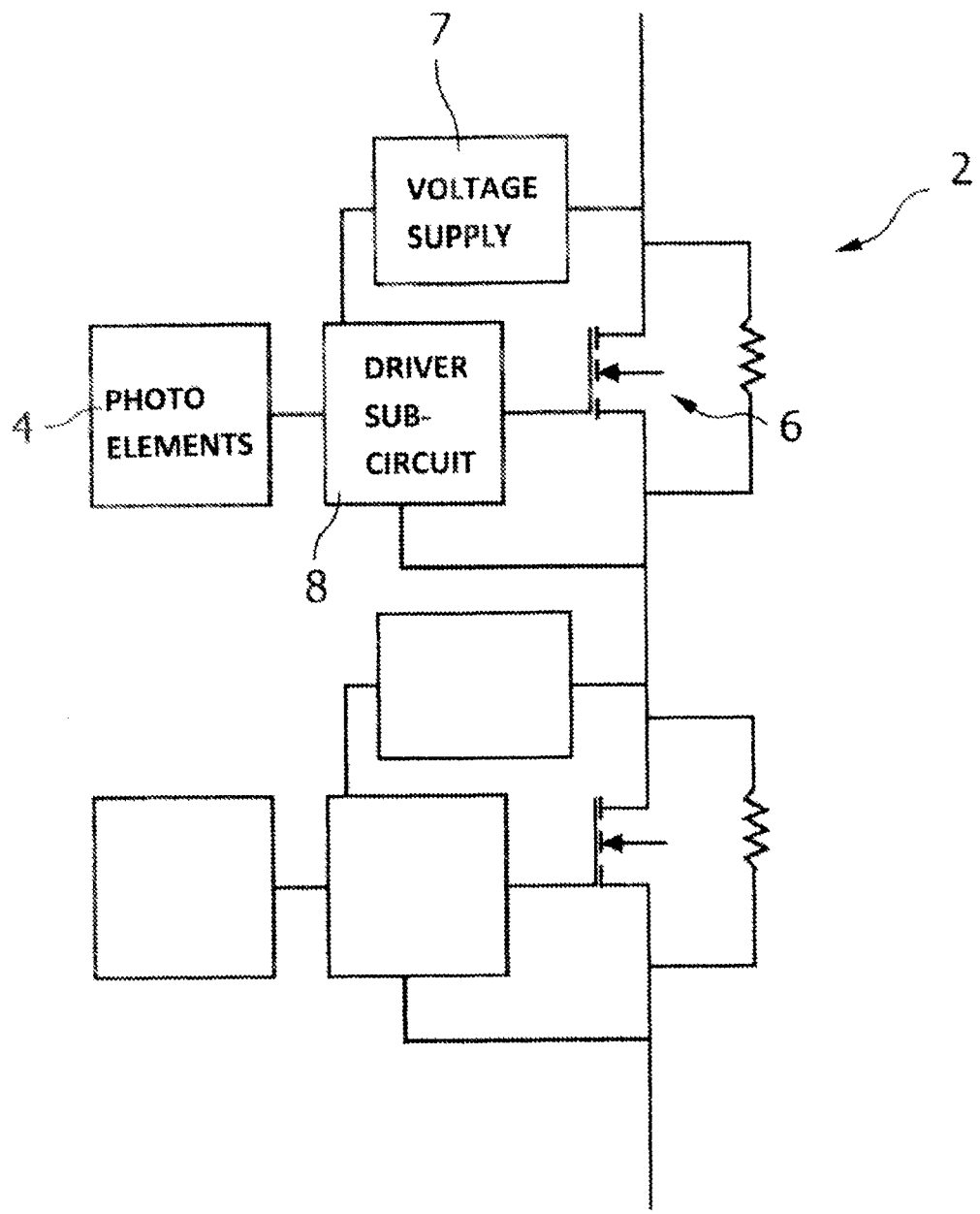
FIG. 2 shows two stages of the switching circuit according to an embodiment of the invention.

FIG. 2 shows two stages 2 of the switching circuit 1. The stage 2 can be grouped in the photo element 4, an electronic switch 6 which is preferably a transistor, a high voltage supply 7 comprising an energy storage, and a low power driver stage 8.

Figure 3:
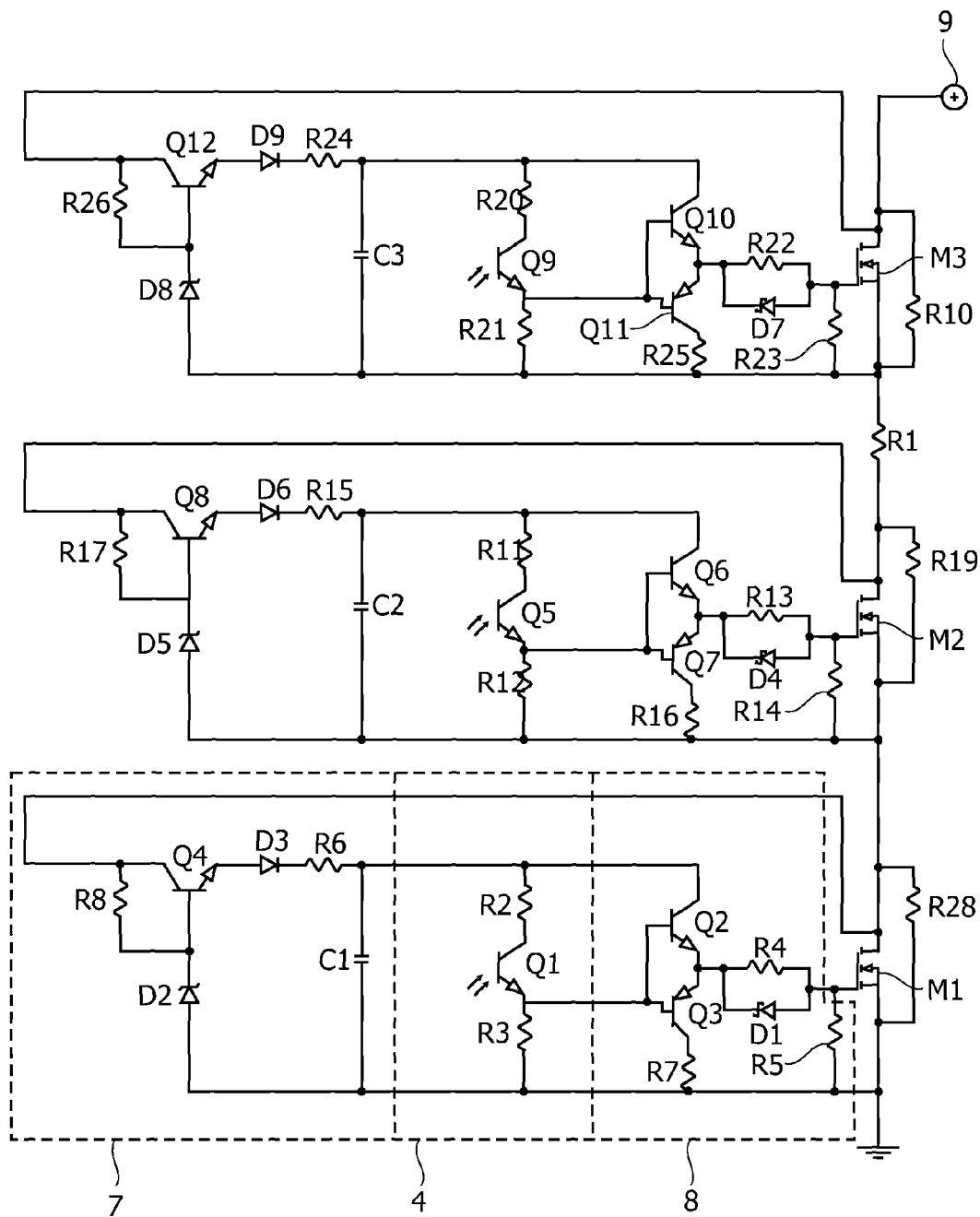
FIG. 3 shows the stages of the switching circuit according to an embodiment of the invention in more detail.

FIG. 3 shows the stages 2 of the switching circuit 1 in more detail. The dashed line boxes marked with the reference numerals 4, 7 and 8 indicate which electronic parts can be assigned to the respective modules shown in FIG. 2. For simplicity reasons, these dashed line boxes are only provided in one of the stages 2, however since the stages are designed identical, the indication applies to all stages.

According to the embodiment shown in FIG. 3, N-channel MOSFETs (metal-oxide-semiconductor field-effect transistors) M1-M3 are provided as electronic switches 6 in each of the stages 2. However, also an IGBT (insulated gate bipolar transistor, e.g. IXGH 25N160 or IXGT 25N160) can be used instead of a MOSFET (e.g. IXTH 12N120). As already mentioned, the MOSFETs M1-M3 of the stages 2 are arranged in series, i.e. the source (or the collector if an IGBT is used) of one of the MOSFETs (e.g. M3) is connected with the drain (or the emitter if an IGBT is used) of a consecutive MOSFET (e.g. M2). The drain of the outermost MOSFET M3 of the series is connected with the positive potential 9 resulting for example from the electric load carried by a high voltage cable, and the source of the outermost MOSFET M1 at the end of the series distant thereto is grounded (e.g. negative potential of the cable). The MOSFETs M1-M3 arranged in series thus form a series conduction line for connecting the electric potentials of the cable or any other load to be discharged or switched. At any position in the series, a damping resistor R1 (e.g. 100Ω) can be provided, which restricts the current flow through the series conduction line in a state in which all the MOSFETs M1-M3 are in their closed states, in order to prevent the MOSFETs M1-M3 from being damaged. In parallel to the MOSFETs M1-M3 respective resistors R10, R19, R28 (e.g. 10000 kΩ) are provided such that one terminal of the resistor R10, R19, R28 is connected to the drain of the respective MOSFET M1-M3, and the other terminal of the resistor R10, R19, R28 is connected to the source of the respective MOSFET M1-M3. These resistors R10, R19, R28 function as static symmetry resistors which divide the high voltage applied to the switching circuit 1 equally to all of the stages 2 when the MOSFETs M1-M3 are in their opened states. In the present embodiment this is a potential of 800 V per stage 2, i.e. between the drain and source of any of the opened MOSFETs M1-M3.

In the following description only one of the stages 2 is described. Since the stages 2 are identical, the description applies to all of the stages 2 and their electronic parts even if identical electronic parts in different stages 2 are marked with different reference signs in FIG. 3.

A resistor R26 (e.g. 10000 kΩ), a transistor Q12 (a NPN type transistor) and a zener diode D8 (e.g. BZX84C15L) are connected such that one terminal of the resistor R26 is connected to the drain of the MOSFET M3 and also to the collector of the transistor Q12. The base of the transistor Q12 is connected to the other terminal of the resistor R26 and to the cathode of the zener diode D8. The anode of the zener diode D8 is connected to the source of the MOSFET M3. In this configuration, the zener diode D8 causes a potential difference of 15 V between its cathode and anode. The rest of the potential difference applied to the drain-source passage of the MOSFET M3 is applied across the resistor R26. The resistor R26 also functions as a current limiting element for protecting the zener diode D8. The emitter of the transistor Q12 is connected with the anode of a diode D9 (e.g. 1N4148). The cathode of the diode D9 is connected with a terminal of a capacitor C3 (energy storage) via a resistor R24 (e.g. 470Ω). The other terminal of the capacitor C3 is connected to the source of the MOSFET M3. When the transistor Q12 is in its closed state (collector-emitter low-resistive) the capacitor C3 is charged by a current flowing from the drain of the MOSFET M3 via the collector-emitter-passage of the transistor Q12, the diode D9 and the resistor R24. The more the capacitor C3 is charged, the higher the potential at the emitter of the transistor Q12 becomes until the transistor Q12 opens its collector-emitter passage when reaching a certain base-emitter potential difference. When the capacitor C3 is discharged as explained below, the potential at the emitter of the transistor Q12 drops again and initiates the closing of its collector-emitter passage. The resistor R24 functions as a current limiting element and/or current adjustment element, because otherwise when the capacitor C3 is in a completely discharged state, the initial charging current might be too high. The diode D9 prevents the capacitor C3 from discharging via the transistor Q12. Instead of the just described design of the high voltage supply 7 also two circuits similar to the ones just described can be arranged in series wherein each of the two circuits delivers half of the voltage output of the high voltage supply 7. Further, it can be envisaged to use a buck converter as the high voltage supply 7 instead of the design shown in FIG. 3. Instead of the capacitor C3 also an accumulator could be used.

Further, a photo transistor Q9 is provided as photo element and positioned for receiving light emitted from the light source 5. The collector of the photo transistor Q9 is connected via a resistor R20 (e.g. 2200Ω) to the terminal of the capacitor C3 which is also connected to the resistor R24. The emitter of the photo transistor Q9 is connected with a terminal of a resistor R21 (e.g. 100 kΩ), with the base of a transistor Q10 (e.g. 2N5089) and with a base of a transistor Q11 (e.g. 2N4126). The transistor Q10 is of a NPN-type, and the transistor Q11 is of a PNP-type. The other terminal of the resistor R21 is connected with the source of the MOSFET M3. Due to the highly resistive R21, in case of the photo transistor Q9 being switched to its closed state by light emitted by the light source 5, a certain part of the potential difference across the charged capacitor C3 is applied to the bases of the transistors Q10 and Q11. As a result, the transistor Q10 is switched to its closed state and the transistor Q11 is switched to its opened state. Such an arrangement is known as push-pull-stage. By means of the closed collector-emitter-passage of the transistor Q10, current can flow from the capacitor C3 (from the capacitor terminal which is connected with the resistor R20) to the gate of the MOSFET M3. Hence, the MOSFET M3 is switched in its closed state, in which the drain-source-passage is low-resistive. Since all MOSFETs M1-M3 are switched simultaneously, the entire series conduction line is low-resistive and can ground the potential 9.

When the light source 5 is turned off, the photo transistor Q9 is switched in its opened state which pulls the potential at the bases of the transistors Q10 and Q11 to the potential present at the source of the MOSFET M3. As a result, the transistor Q10 switches in its opened state and the transistor Q11 switches in its closed state. Then, the gate of the MOSFET M3 can be pulled to the potential present at the source of the MOSFET M3 via a resistor R25 (e.g. 10Ω). Additionally, between the gate of the MOSFET M3 and the source of the MOSFET M3 a resistor R23 (e.g. 10 kΩ) is provided for ledging purposes as known from the state of the art. A gate resistor R22 (e.g. 10Ω) is connected in between the gate of the MOSFET M3 and the emitter of the transistor Q10. The gate resistor R22 allows adjustment of the MOSFET turn-on speed. During the turn-off, the Schottky diode D7 (e.g. 1N5818) which is anti-parallel to the resistor R22 shunts out the gate resistor R22, in order to enhance speed of the MOSFET gate discharging.

According to a yet further embodiment, each stage 2 can comprise, additionally to the design shown in FIG. 3 and described above, a photovoltaic element (e.g. CPC 1831) for additionally charging the capacitor C3. Also, plural photovoltaic elements can be used and arranged in series. This single photovoltaic element or the series of photovoltaic elements is/are provided in parallel to the capacitor C3. When the light source 5 is turned on and causes a discharging of the capacitor C3 as described above, the light emitted by the light source 5 is received by the photo voltaic element and supplied to the capacitor C3. This has the effect that current can be supplied from the capacitor C3 to the gate of the MOSFET M3 for an extended time period.

Figure 4:
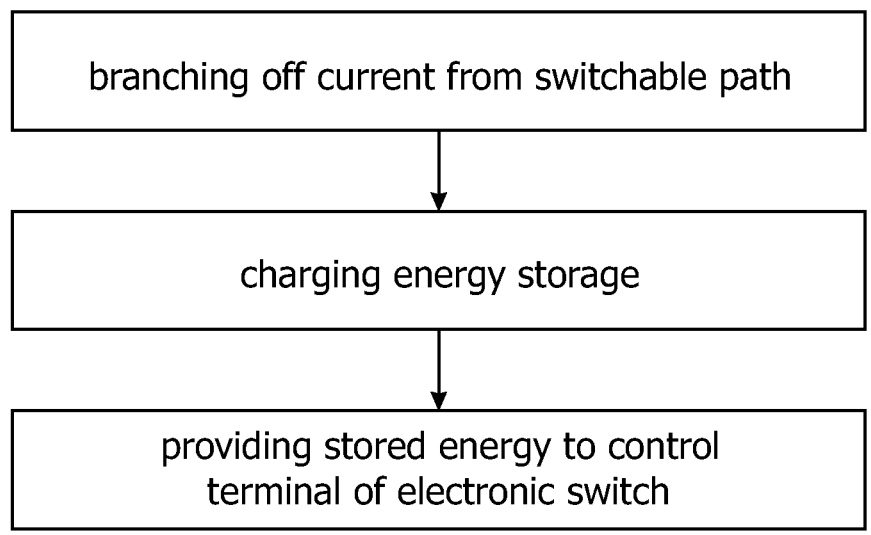
FIG. 4 shows a method for discharging the electric load according to the invention.

FIG. 4 shows a method for discharging the electric load according to the above described embodiments. Due to the opened switching path of the electronic switch 6, M1, M2, M3 a certain potential difference is applied across the switching path of each electronic switch 6, M1, M2, M3, i.e. a voltage between the drain and source of the MOSFETs M1, M2, M3 or the collector and emitter of the IGBT. From this switchable path within each stage 2, in particular at the drain (or collector) of the MOSFET (or IGBT), a current is branched off. This current is fed to the energy storage C1, C2, C3 of each stage 2. In order to be able to branch off the current, the respective electronic switch 6, M1, M2, M3 has to be in an opened state in order to have the voltage present for driving the current flow. When a switching of the switching circuit is initiated by means of the light source 5 as mentioned above, the energy which is stored in the energy storage C1, C2, C3 is provided to the control terminal of the electronic switch 6, M1, M2, M3. This causes the switching of the switchable path of the electronic switch 6, M1, M2, M3 to its closed state which is then maintained at least temporarily.

Figure 5:
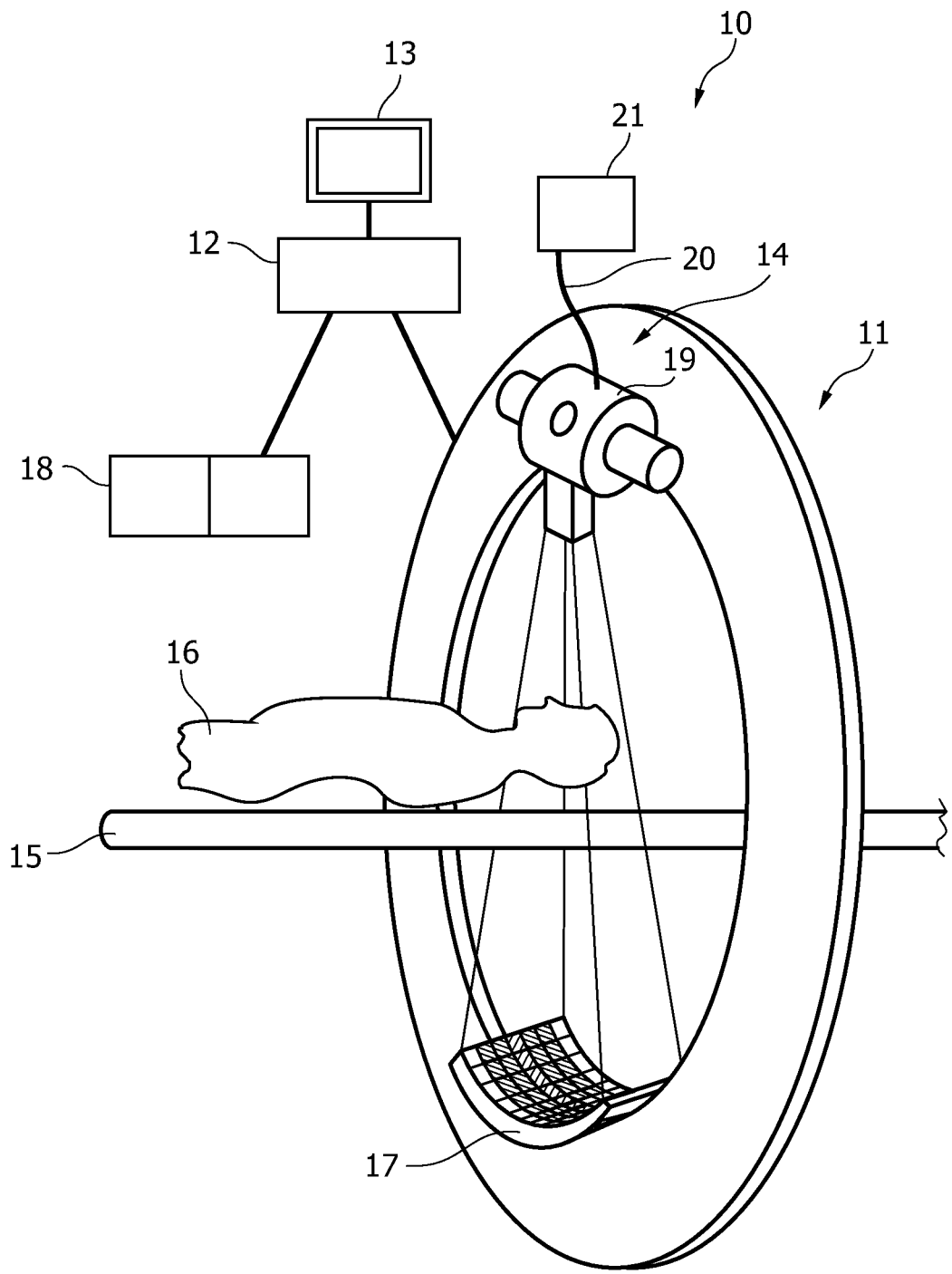
FIG. 5 shows a medical imaging system.

FIG. 5 schematically shows a medical imaging system 10 for generating a composite medical view/image in which the above described switching circuit can be used. The medical imaging system 10 comprises an image acquisition device 11, a data processing unit 12 and a display device 13. For example, the medical imaging system is an X-ray imaging system, comprising an X-ray generator 14. The X-ray generator 14 comprises an X-ray tube 19 provided to generate X-ray radiation and a high voltage generator 21 which supplies electric power to the X-ray tube 19 via a high voltage cable 20. In FIG. 5 the X-ray tube 19 and the high voltage generator 21 are schematically illustrated as separate devices, however they can also be integrated in a single housing. A table 15 is provided to receive a patient 16 to be examined. Further, an X-ray image detection module 17 is located opposite the X-ray generator 14. The latter is sending data to the data processing unit 12 which is connected to both, the detection module 17 and the X-ray generator 14. The data processing unit 12 is located in the vicinity of the table 15. Furthermore, the display 13 is arranged in the vicinity of the table 15 to display information to a person operating the X-ray imaging system. Also, an interface unit 18 is arranged to input information or commands by the user. Basically, the image detection module 17 generates image data by exposing the subject to X-ray radiation, wherein said images are further processed in the data processing unit 12. It is noted that the example shown is a so-called CT-type X-ray image acquisition device. The invention also relates to other types of X-ray image acquisition devices, such as CV-type X-ray image acquisition devices. In particular, the above described switching circuit is applicable in dual energy X-ray systems and high speed grid switches for CV and CT applications.

It is explicitly intended that the teaching of this invention covers any combination of the above described embodiments.

While the invention has been illustrated and described in detail in the drawings and foregoing description, such illustration and description are to be considered illustrative or exemplary and not restrictive and it is not intended to limit the invention to the disclosed embodiments. The mere fact that certain measures are recited in mutually different dependent claims does not indicate that a combination of these measures cannot be used advantageously. Any reference signs in the claims should not be construed as limiting the scope of the invention.

The invention claimed is:

1. A switching circuit comprising:
 a plurality of stages each comprising:
  an electronic switch having a switchable path controllable by means of a control terminal, wherein the switchable paths of the electronic switches are connected in series in between electric potentials to be switched;
  an energy storage which is charged while the respective electronic switch is in an opened state with a current branched off from the switchable path within the stage and caused by a voltage drop across the opened switchable path; and
  a driver sub-circuit for switching the electronic switch by means of providing the control terminal of the electronic switch with energy stored in the energy storage for closing the switchable path of the electronic switch and maintaining the closed state at least temporarily,
 wherein each stage further comprises a photo element for initiating a switching of the electronic switch,
 wherein each stage further comprises at least one photovoltaic element for additionally charging the energy storage, wherein the photo element and the at least one photovoltaic element are configured for receiving light from a light source configured for initiating the switching of the electronic switches.

2. The switching circuit according to claim 1, wherein each stage is designed identically.

3. The switching circuit according to claim 1, wherein the stages are free of connection lines among each other besides the connection along the switchable paths of the electronic switches.

4. An X-ray generator comprising a switching circuit according to claim 1.

5. A medical imaging system comprising a switching circuit according to claim 1.

6. The switching circuit of claim 1, further comprising a light source and configured for operating said light source for the closing of said electronic switches simultaneously.

7. The switching circuit of claim 6, further comprising an electric load connected in series with the switchable paths, said switching circuit being further configured for discharging said load via the simultaneous closings.

8. The switching circuit of claim 6, said plurality amounting to 45 to 200 stages.

9. The switching circuit of claim 1, said plurality amounting to 3 or more stages.

10. A method for switching electric potentials by means of a switching circuit, the switching circuit comprising a plurality of stages, each stage comprising an electronic switch having a switchable path controllable by means of a control terminal, wherein the switchable paths of the electronic switches are connected in series in between the electric potentials to be switched and are switchable open via said means, the method comprising the steps:
 branching off a current from the switchable path within each stage caused by a voltage drop across the opened switchable path;
 charging an energy storage of each stage while the respective electronic switch is in an opened state with the branched off current;
 providing energy stored in the energy storage to the control terminal of the electronic switch for switching the switchable path of the electronic switch to its closed state and maintaining the closed state at least temporarily; and
 charging the energy storage by means of at least one photovoltaic element.

11. The method according to claim 10, further comprising the step of initiating the switching of the electronic switch by means of a photo element provided in each stage.

12. A high voltage generator for X-rays comprising a switching circuit said switching circuit comprising:
 a plurality of stages each comprising:
  an electronic switch having a switchable path controllable by means of a control terminal, wherein the switchable paths of the electronic switches are connected in series in between electric potentials to be switched;
  an energy storage which is charged while the respective electronic switch is in an opened state with a current branched off from the switchable path within the stage and caused by a voltage drop across the opened switchable path; and
  a driver sub-circuit for switching the electronic switch by means of providing the control terminal of the electronic switch with energy stored in the energy storage for closing the switchable path of the electronic switch and maintaining the closed state at least temporarily; and
 an activator for initiating a switching of said electronic switches simultaneously for the closing of said switchable path.

13. The switching circuit of claim 12, said activator being a light source, each stage further comprising a photo element for said initiating responsive to said light source.

14. A switching circuit comprising:
 at least three stages, each comprising:
  an electronic switch having a switchable path controllable by means of a control terminal, wherein the switchable paths of the electronic switches are connected in series in between electric potentials to be switched;
  an energy storage which is charged while the respective electronic switch is in an opened state with a current branched off from the switchable path within the stage and caused by a voltage drop across the opened switchable path; and
  a driver sub-circuit for switching the electronic switch by means of providing the control terminal of the electronic switch with energy stored in the energy storage for closing the switchable path of the electronic switch and maintaining the closed state at least temporarily.

15. Switching circuit (1) according to claim 14, wherein each stage further comprises at least one photovoltaic element for additionally charging the energy storage.

16. The switching circuit according to claim 14, wherein a stage from among said stages comprises, for external connection of said stage, only two terminals for connection lines, said electronic switch, of said stage, being arranged in between said two terminals.

17. The switching circuit of claim 14, wherein each stage is designed identically.

18. The switching circuit of claim 14, each of the stages being configured, for external connection of the stage, with only two terminals for connection lines.

19. The switching circuit of claim 18, configured such that the two terminals are for respective external connection to a pair of said stages.

20. The switching circuit of claim 14, said at least three stages amounting to 45 to 200 stages.

\* \* \* \* \*